(12) United States Patent
Sun

(10) Patent No.: US 7,609,517 B2
(45) Date of Patent: Oct. 27, 2009

(54) AIR GUIDING PLATE

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 33 days.

(21) Appl. No.: 11/953,861

(22) Filed: Dec. 11, 2007

(65) Prior Publication Data

US 2008/0204996 A1 Aug. 28, 2008

(30) Foreign Application Priority Data

Feb. 27, 2007 (CN) .................... 2007 1 0200234

(51) Int. Cl.
*H05K 7/20* (2006.01)

(52) U.S. Cl. .................. 361/692; 361/690; 361/694; 361/695; 361/816; 361/818; 454/162; 454/184

(58) Field of Classification Search ......... 361/690–697, 361/741, 752, 687, 688, 816, 818, 831; 454/184; 165/121–126, 80.3, 80.4, 104.33, 185, 140; 312/223.2, 223.3, 236; 174/35 R, 50, 52.4, 174/360, 357, 377, 382, 385
See application file for complete search history.

(56) References Cited

U.S. PATENT DOCUMENTS

| | | | | |
|---|---|---|---|---|
| 5,297,004 A * | 3/1994 | Mazura | ...................... | 361/690 |
| 5,372,543 A * | 12/1994 | Steele | ........................ | 454/184 |
| 5,462,569 A * | 10/1995 | Benjamin | .................. | 55/385.6 |
| 5,676,718 A * | 10/1997 | Davison et al. | ............ | 55/385.6 |
| 5,892,654 A * | 4/1999 | Worden, Jr. | ................. | 361/690 |
| 6,680,847 B2 * | 1/2004 | Heard | ........................ | 361/692 |
| 6,947,294 B2 * | 9/2005 | Lin et al. | .................... | 361/818 |
| 7,173,822 B2 * | 2/2007 | Liang et al. | ................. | 361/695 |
| 7,492,610 B2 * | 2/2009 | Gilliland | .................... | 361/818 |

\* cited by examiner

*Primary Examiner*—Michael V Datskovskiy
(74) *Attorney, Agent, or Firm*—Frank R. Niranjan

(57) ABSTRACT

In one embodiment, an air guiding plate is attached to an enclosure with a plurality of vents defined therein. The air guiding plate includes a plurality of guiding holes defined therein. Each of the guiding holes is surrounded by a plurality of walls and includes an inlet with a large size, and an outlet with a small size. The outlets are in alignment with the vents of the enclosure. A size in cross section of each of the walls gradually decreases along a direction from the inlet to the outlet.

12 Claims, 7 Drawing Sheets

AIR GUIDING PLATE

BACKGROUND

1. Field of the Invention

The present invention relates to air guiding plates attached to an enclosure of an electronic device for smoothing airflow into and out of the enclosure.

2. Description of Related Art

With the ongoing development of electronics technology, many computer components operate at higher and higher frequencies while becoming smaller and smaller. More heat generated by higher frequency components requires more cooling. In addition, higher frequency components generate more electromagnetic interference (EMI). If the EMI is not properly shielded, it can disrupt operation of other electronic equipment. EMI radiation typically escapes through air ventilation holes of an enclosure of the computer used for cooling purposes. Thus electronic equipment manufacturers often face a trade-off between cooling and shielding of EMI in design. A density of vents of the enclosure is limited due to at least the above-mentioned factors. Thus, air passing through the vents of the enclosure becomes turbulent being blocked by space between vents, leading to poor heat dissipation performance.

Consequently, what is required is air guiding plates for efficiently cooling an electronic device.

SUMMARY

In one embodiment, an air guiding plate is attached to an enclosure with a plurality of vents defined therein. The air guiding plate includes a plurality of guiding holes defined therein. Each of the guiding holes is surrounded by a plurality of walls and includes an inlet with a large size, and an outlet with a small size. The outlets are in alignment with the vents of the enclosure. A size in cross section of each of the walls gradually decreases along a direction from the inlet to the outlet.

Other advantages and novel features of the present invention will become more apparent from the following detailed description of preferred embodiments when taken in conjunction with the accompanying drawings, in which:

DETAILED DESCRIPTION OF THE INVENTION

Figure 1:
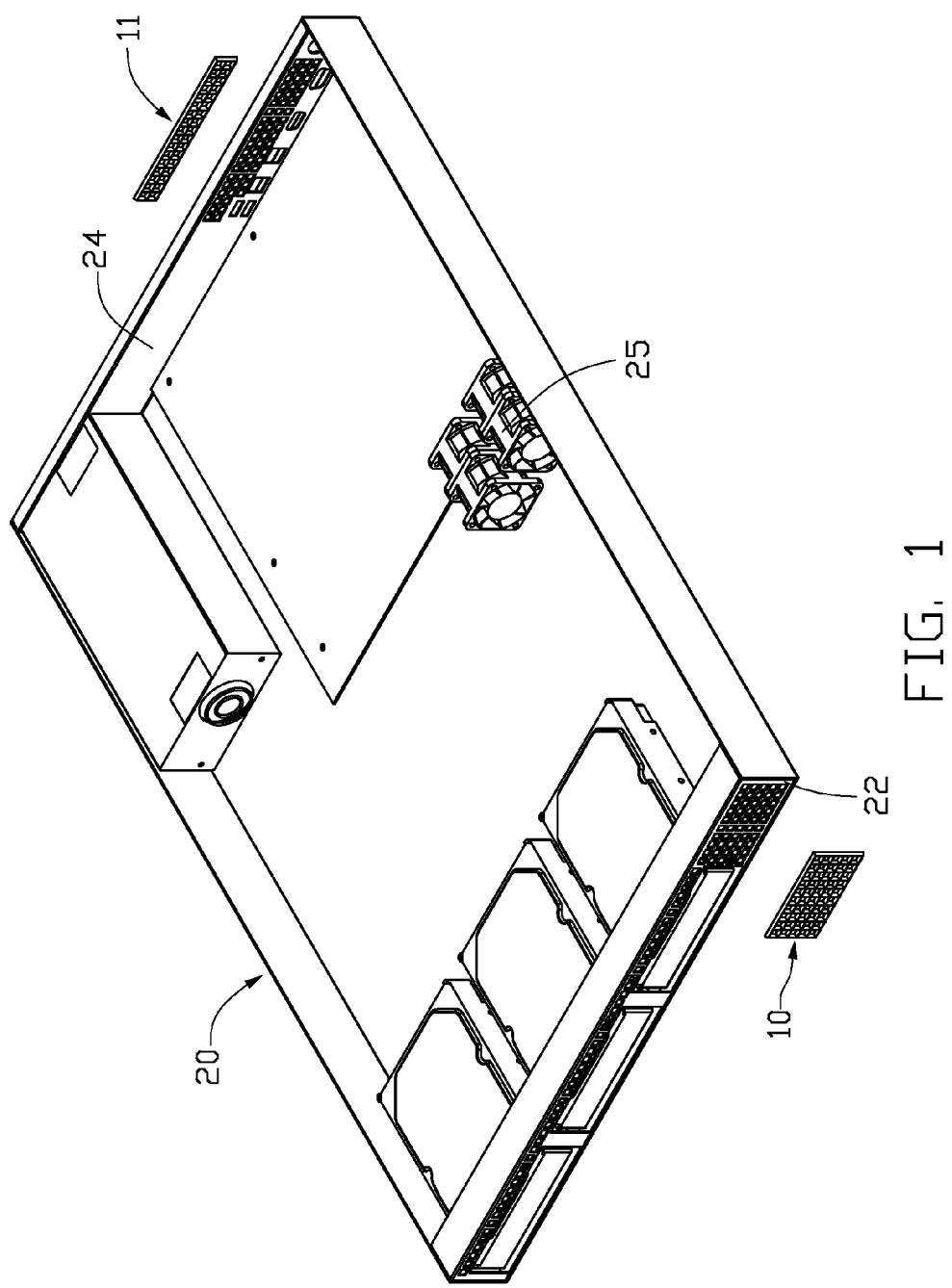
FIG. 1 is an exploded, isometric view of air guiding plates according to an embodiment of the present invention, together with an enclosure of an electronic device.
Figure 2:
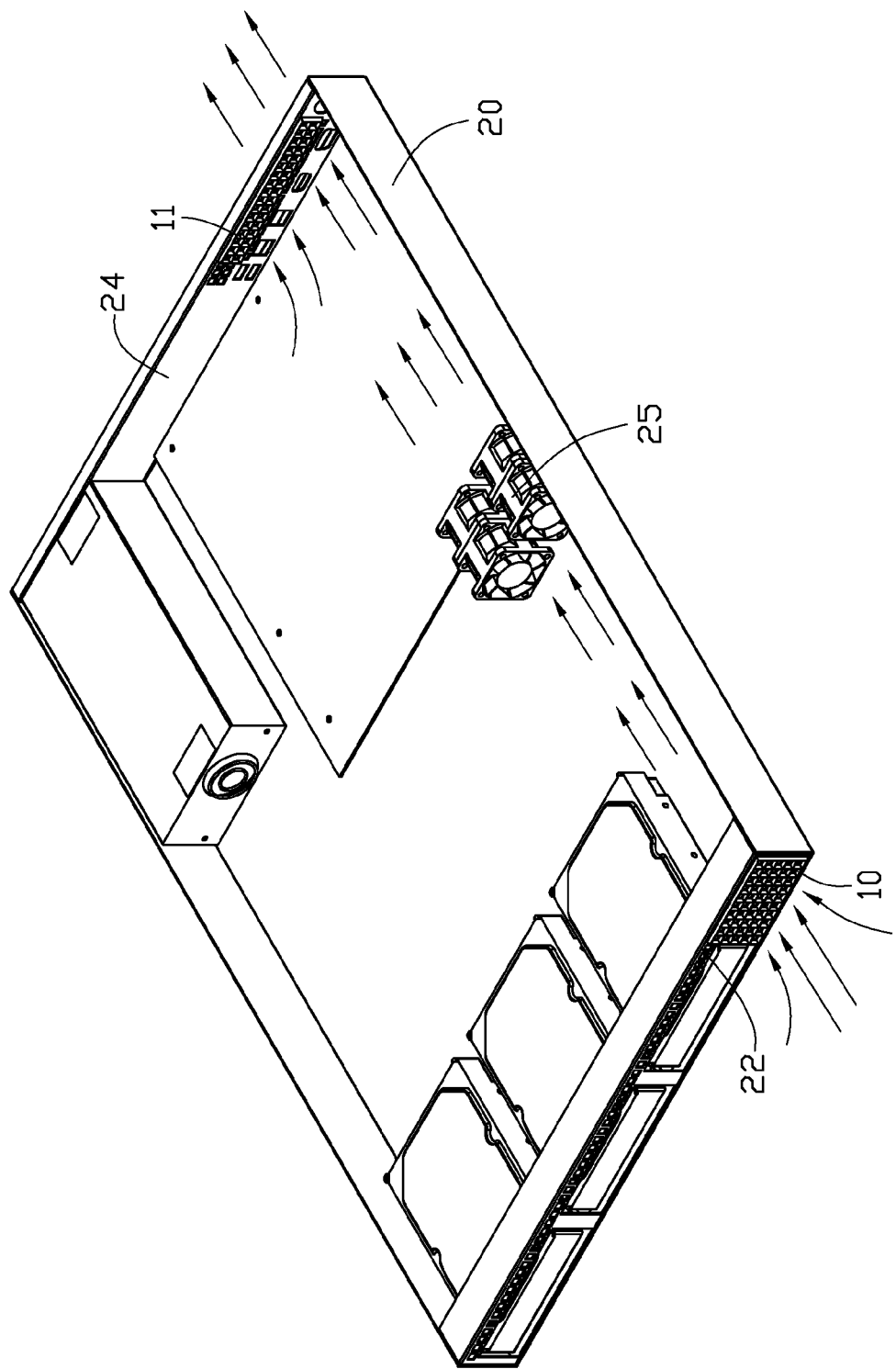
FIG. 2 is an assembled view of the air guiding plates attached to the enclosure of FIG. 1.

Referring to FIGS. 1 and 2, in an embodiment of the invention, a first air guiding plate 10 and a second air guiding plate 11 are provided to be attached to an enclosure 20 of an electronic device to smooth airflow. The electronic device is a server.

The enclosure 20 includes a first sidewall 22, and a second sidewall 24 opposite to the first sidewall 22. A plurality of vents is defined in the first sidewall 22 and the second sidewall 24. The server includes a plurality of hard disk drives installed in the enclosure 20 near the first sidewall 22, a circuit board installed near the second sidewall 24, and a plurality of system fans 25 installed in the middle thereof. In this embodiment, air flows into the enclosure 20 from the first sidewall 22 to the second sidewall 24.

The first air guiding plate 10 is attached to an outside surface of the first sidewall 22. The second air guiding plate 11 is attached to an inside surface of the second sidewall 24. The first air guiding plate 10 and the second air guiding plate 11 have same structure, but different size according to space available and need. Hereafter, only the second air guiding plate 11 is described in detail.

Figure 3:
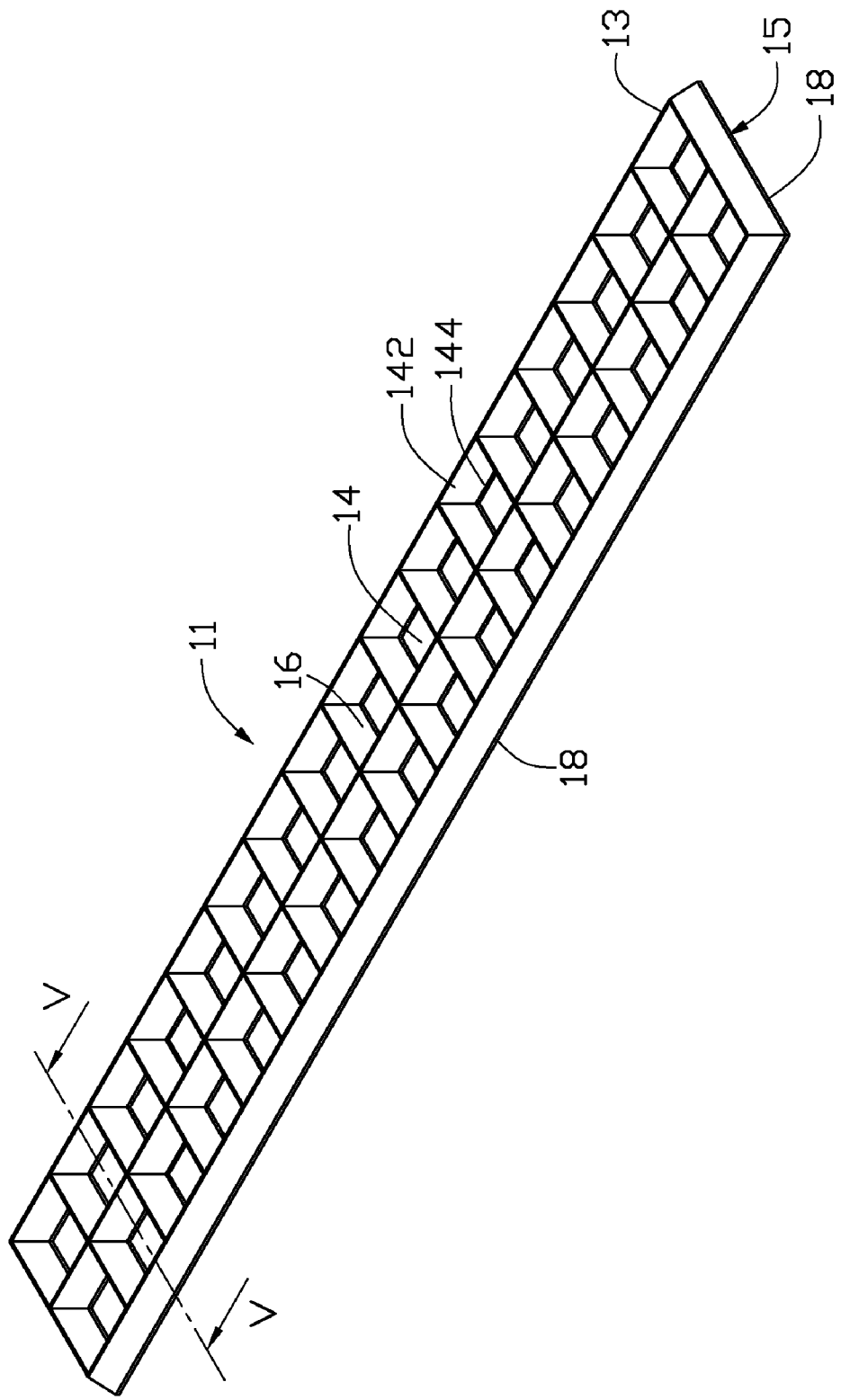
FIGS. 3 and 4 are enlarged, isometric views of one of the air guiding plates of FIG. 1, viewed in opposite aspects.
Figure 4:
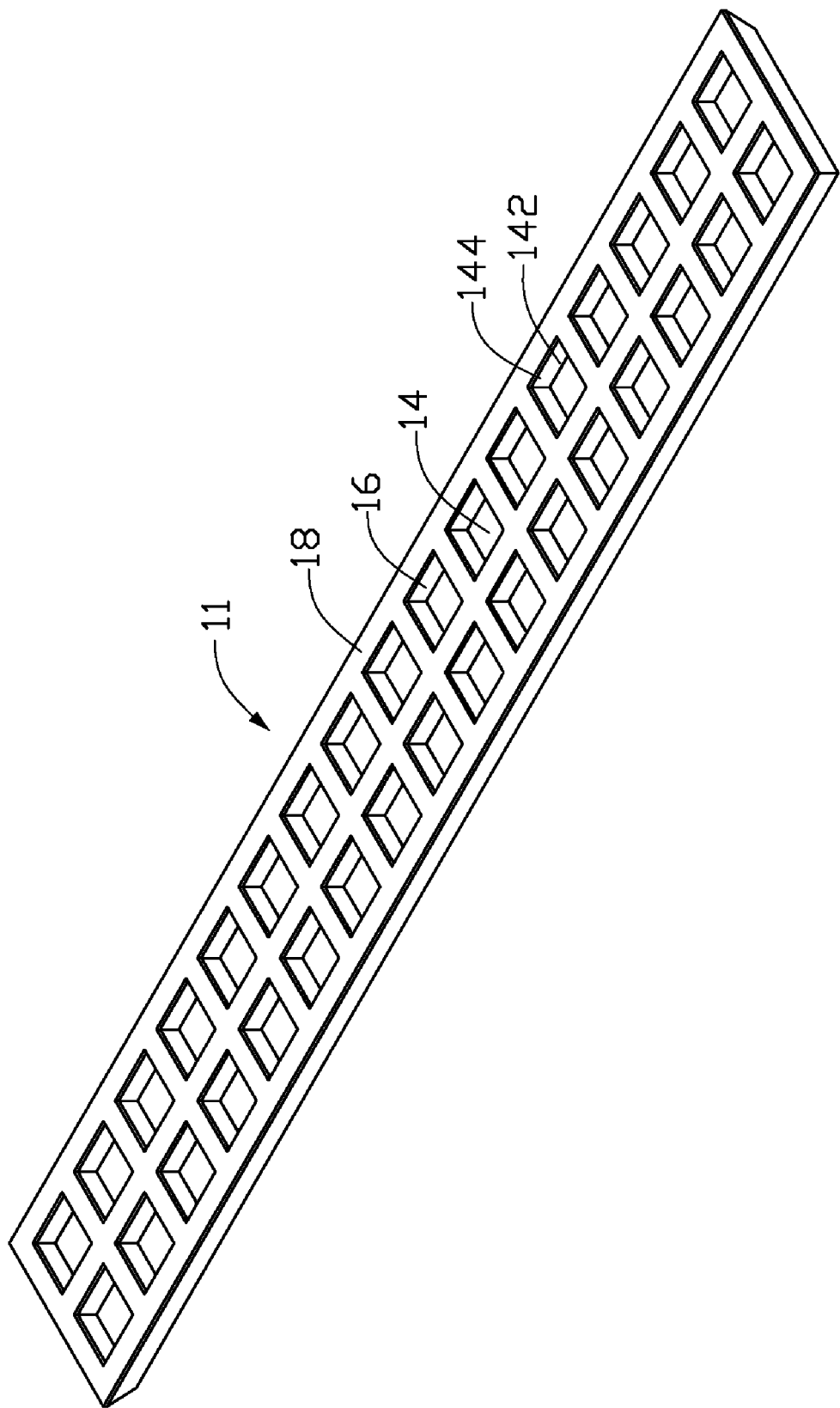
Figure 5:
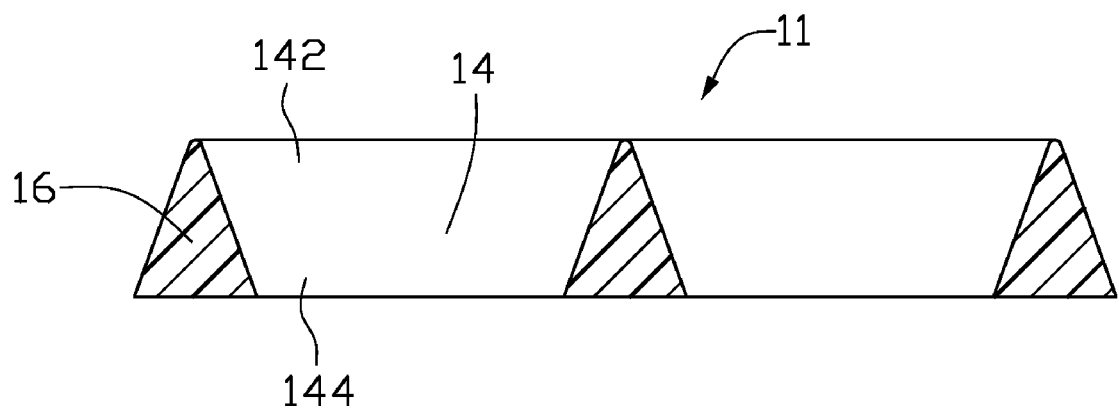
FIG. 5 is a cross-sectional view along line V-V of FIG. 3.
Figure 6:
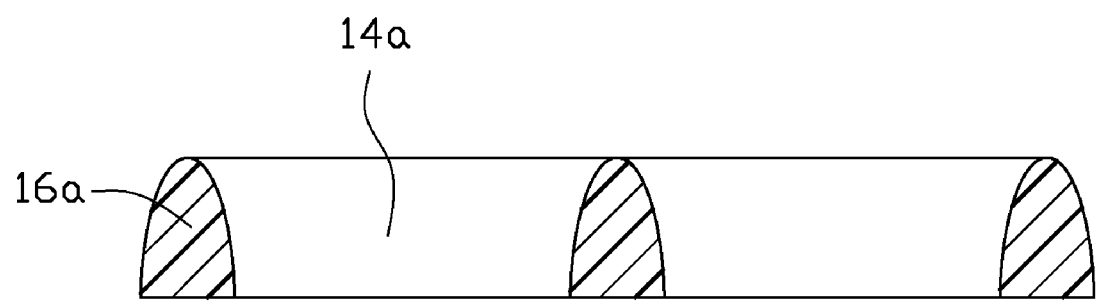
FIG. 6 is a cross-sectional view of an air guiding plate according to another embodiment of the present invention.

Referring to FIGS. 3 and 4, the second air guiding plate 11 includes a first surface 13, and a second surface 15 opposite to the first surface 13. A plurality of guiding holes 14 is defined in the second air guiding plate 11 through the first surface 13 and the second surface 15 therein. Each of the guiding holes 14 is surrounded by a plurality of walls 16. Every two adjacent guiding holes 14 include a common wall 16. Referring also to FIG. 5, each of the guiding holes 14 includes an inlet 142 in the first surface 13 with a large size, and an outlet 144 in the second surface 15 with a small size. The outlets 144 are in alignment with the vents of the enclosure 20. The inlets 142 are defined close together in the first surface 13. In cross section, each of the walls 16 surrounding the guiding holes 14 becomes larger along a direction from the inlet 142 to the outlet 144. The walls 16 are generally triangle-shaped in cross-section. Referring to FIG. 6, in another embodiment, a cross-section of a wall 16a surrounding the guiding hole 14a of an air guiding plate is generally semi-ellipsoidal-shaped. An adhesive layer 18 is attached to the second surface 15 of the second air guiding plate 11, for attaching the second air guiding plate 11 to the inside surface of the second sidewall 24 of the enclosure 20. Similarly, an adhesive layer can be attached to a surface with outlets of the first air guiding plate 10, for fixing the first air guiding plate 10 to the inside surface of the first sidewall 22 with outlets thereof in alignment with the vents of the first sidewall 22.

Referring to FIG. 2, air is drawn into the enclosure 20 from the first sidewall 22 by the system fans 25 and then exhuasted from the second sidewall 24. The inlets of the first air guiding plate 10 allow air to flow smoothly in. At the same time, the inlets 142 of the second air guiding plate 11 allow exhaust air to flow smoothly out.

Figure 7:
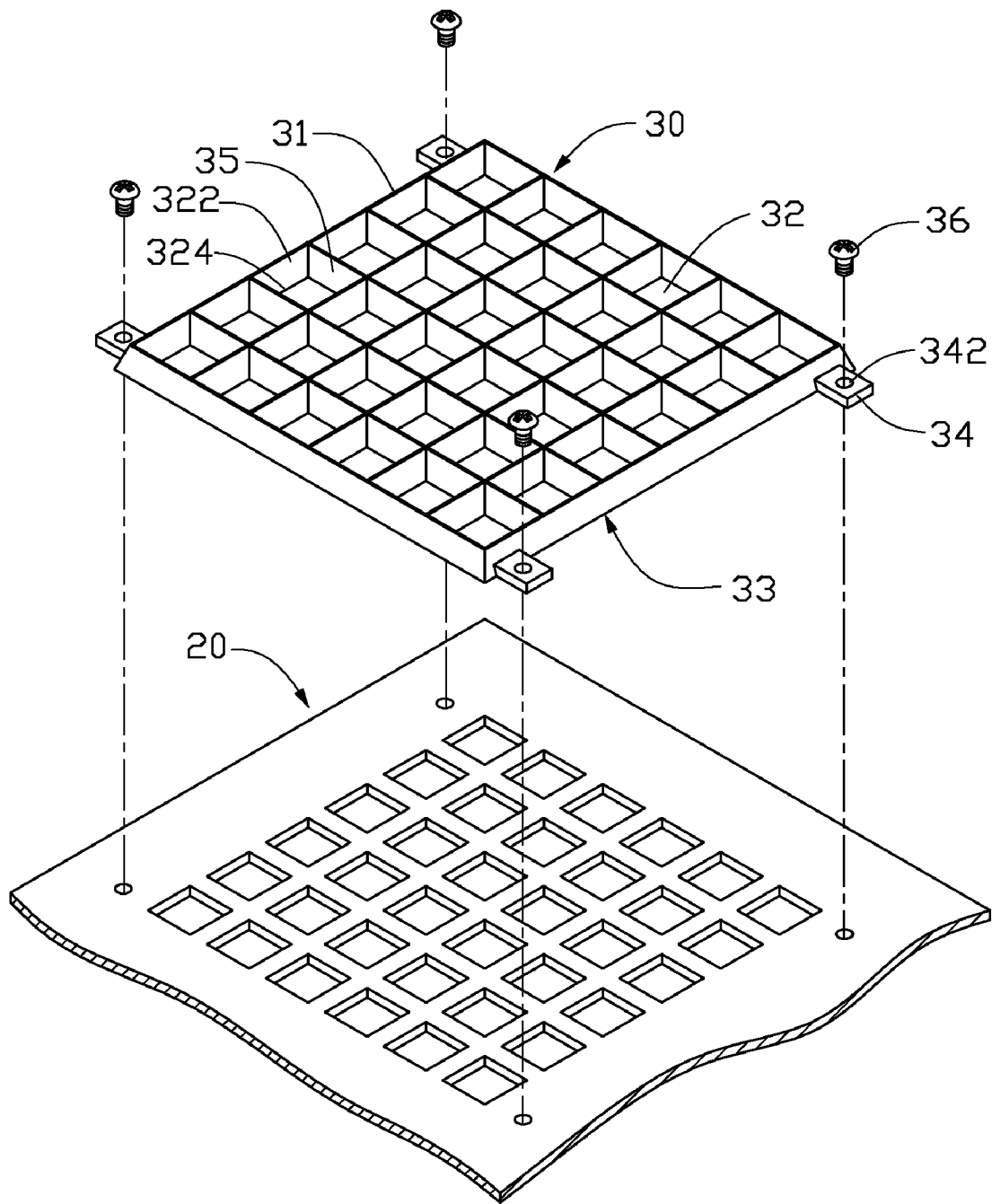
FIG. 7 is an exploded, isometric view of an air guiding plate according to a further embodiment of the present invention and an enclosure of an electronic device.

Referring to FIG. 7, in a further embodiment of the present invention, an air guiding plate 30 attached to the enclosure 20 also has same structure and same working mode as the air guiding plates of the foregoing embodiment, but with different size and different mounting means. The air guiding plate 30 includes a first surface 31, a second surface 33, and a plurality of guiding holes 32 defined therein. Each of the guiding holes 32 includes an inlet 322 with a larger size in the first surface 31, and an outlet 324 with a small size in the second surface 33. Each of the guiding holes 32 is surrounded by a plurality of walls 35. The outlets 324 have same size with the vents of the enclosure 20. The inlets 322 are defined in the first surface 31 and close to each other. A plurality of tabs 34 each defining an aperture 342 extends from the air guiding plate 30. The enclosure 20 includes a plurality of fixing holes defined therein. A plurality of conventional fasteners 36 extends through the apertures 342 of the air guiding plate 30 and engages in the fixing holes of the enclosure 20, thereby to attach the air guiding plate 30 to the enclosure 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An air guiding plate attached to an enclosure with a plurality of vents of an electronic device, the air guiding plate comprising:
    a plurality of guiding holes defined therein, each of the guiding holes surrounded by a plurality of walls, every two adjacent guiding holes comprising a common wall, each of the guiding holes comprising an inlet, and an outlet, the outlets in alignment with the vents of the enclosure, in cross-section, each of the walls increase in size along a direction from the inlet to the outlet.

2. The air guiding plate as described in claim 1, wherein the cross-section of each of the walls is triangular-shaped.

3. The air guiding plate as described in claim 1, wherein the cross-section of each of the walls is semi-ellipsoidal-shaped.

4. The air guiding plate as described in claim 1, wherein a size of each of the guiding holes is gradually decreased from the inlet to the outlet.

5. The air guiding plate as described in claim 1, further comprising an adhesive layer, wherein the adhesive layer is attached to a surface of the guiding plate with outlets, for easily attaching the guiding plate to the enclosure.

6. The air guiding plate as described in claim 1, wherein a plurality of tabs defining apertures extends from the guiding plate, a plurality of fasteners extends through the apertures to engage with the enclosure.

7. An electronic device comprising:
    an enclosure comprising a pair of sidewalls opposite to each other, a plurality of vents defined in the sidewalls; and
    a pair of air guiding plates each comprising a plurality of guiding holes defined therein, each of the guiding holes comprising an inlet with a large size, and an outlet with a small size corresponding to the corresponding vent of the enclosure, each of the guiding holes surrounded by a plurality of walls, every two adjacent guiding holes comprising a common wall, in cross-section, each of the walls increase in size along a direction from the inlet to the outlet, one of the air guiding plates attached to an outside surface of one of the sidewalls, the other one of the air guiding plates attached to an inside surface of the other of the sidewalls.

8. The electronic device as described in claim 7, wherein the cross section of each of the walls is triangular-shaped.

9. The electronic device as described in claim 7, wherein the cross section of each of the walls is semi-ellipsoidal-shaped.

10. The electronic device as described in claim 7, wherein a size of each of the guiding holes is decreased from the inlet to the outlet.

11. The electronic device as described in claim 7, wherein adhesive layers are attached to surfaces of the air guiding plates with outlets defined therein, for attaching the air guiding plate to the enclosure.

12. The electronic device as described in claim 7, wherein a plurality of tabs defining apertures extends from the air guiding plate, a plurality of fasteners extends through the apertures to engage with the sidewalls of the enclosure.

* * * * *